(12) United States Patent
Chen et al.

(10) Patent No.: US 6,465,937 B1
(45) Date of Patent: Oct. 15, 2002

(54) SINGLE CRYSTAL THICKNESS AND WIDTH CUTS FOR ENHANCED ULTRASONIC TRANSDUCER

(75) Inventors: Jie Chen, North Andover, MA (US); Rajesh Kumar Panda, Nashua, NH (US); Turuvekere R Gururaja, Discovery Bay (HK); Heather Beck, Clemsford, MA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/521,167

(22) Filed: Mar. 8, 2000

(51) Int. Cl.$^7$ ............................................... H01L 41/04
(52) U.S. Cl. ..................................................... 310/360
(58) Field of Search ............................. 310/313 A, 358, 310/360; 252/62.9 PZ (56) References Cited

U.S. PATENT DOCUMENTS

| | | | |
|---|---|---|---|
| 4,109,359 A | 8/1978 | Cross | 29/25.35 |
| 4,313,839 A | 2/1982 | Fesenko et al. | 252/62.9 |
| 4,613,784 A | 9/1986 | Haun et al. | 310/358 |
| 4,658,176 A | 4/1987 | Nakaya et al. | 310/334 |
| 4,683,396 A | 7/1987 | Takeuchi et al. | 310/358 |
| 4,728,845 A | 3/1988 | Haun et al. | 310/358 |
| 5,295,487 A | 3/1994 | Saitoh et al. | 128/662.03 |
| 5,345,139 A | 9/1994 | Gururaja et al. | 310/358 |
| 5,402,791 A | 4/1995 | Saitoh et al. | 128/662.03 |
| 5,539,965 A | 7/1996 | Safari et al. | 29/25.35 |
| 5,790,156 A | 8/1998 | Mutton et al. | 347/71 |
| 5,804,907 A | 9/1998 | Park et al. | 310/358 |
| 5,935,485 A | 8/1999 | Tani et al. | 252/62.9 |
| 5,945,030 A | 8/1999 | Kimura et al. | 252/62.9 |
| 5,998,910 A | 12/1999 | Park et al. | 310/358 |
| 6,020,675 A | 2/2000 | Yamashita et al. | 310/358 |
| 2002/0036282 A1 * | 3/2002 | Chiang et al. | 252/62.9 R |

OTHER PUBLICATIONS

Zipparo et al, "Single Crystal PMN–PT and PZN–PT Ultrasonic Imaging Arrays," 2000 IEEE Int'l Symp. on App. Ferroelectrics, Jul. 2–Aug. 2, 2000, pp. 111–114.*

Brahmaroutu, Bhaskar, et. al., Templated Grain Growth of Textured $Sr_2Nb_2O_7$, IEEE, pp. 883–886, 1996.

Harada et al., Dielectric and Piezoelectric Properties of $Pb[(Zn_{1/13}Nb_{2/3})_{0.91}Tl_{0.09}]O_3$ Single Crystal Grown by Solution Bridgman Method, Key Eng. Mtls., vol. 95, 157–158, 1999.

(List continued on next page.)

*Primary Examiner*—Thomas M. Dougherty
*Assistant Examiner*—Peter Medley
(74) *Attorney, Agent, or Firm*—John Vodopia (57) ABSTRACT

This invention is directed to a transducer comprising a lead-based single crystal wherein the crystal is diagonally oriented and has an effective coupling constant of at least 0.70. In one embodiment, the lead-based crystal has the formula $Pb(B'B'')O_3$—$PbTiO_3$ wherein B' is $Mg^{2+}$, $Zn^{2+}$, $Ni^{2+}$ or $Sc^{3+}$ and B" is $Nb^{5+}$, $Ta^{5+}$ or $W^{6+}$. Preferably, the lead-based crystal has of the formula $Pb(B'B'')O_3$—$PbTiO_3$ where B' is $Mg^{2+}$, $Zn^{2+}$, $Sc^{3+}$ and B" is $Nb^{5+}$ or more specifically $Pb(Mg_{1/3}Nb_{2/3})O_3$—$PbTiO_3$ ("PMN—PT"), $Pb(Zn_{1/3}Nb_{2/3})O_3$—$PbTiO_3$ ("PZN—PT"), and $Pb(Sc_{1/3}Nb_{2/3})O_3$—$PbTiO_3$ ("PSN—PT").

The invention also includes a transducer comprising a plurality of lead-based single crystal transducers. In one embodiment the ultrasonic probe comprising one or more piezoelectric components having surfaces that function as transmitting and/or receiving elements; and electrodes placed upon opposite surfaces of the elements, and wherein each lead based piezoelectric component as described above. In addition, the invention includes improved materials for reduced spurious modes. Furthermore, the invention includes diagonally oriented lead-based transducers.

16 Claims, 11 Drawing Sheets

OTHER PUBLICATIONS

Kobayashi, et al., Improved Growth of Large Lead Zinc Niobate Titanate Piezoelectric Single Crystals for Medical Ultrasonic Transducers, Jpn. J. Appl. Phys., vol. 36, p. 6035, 1997.

Kuwata, Jun, et. al., Dielectric and Piezoelectric Properties of $0.91Pb(Zn_{1/13}Nb_{2/3})$ $O_3$–$0.09PbTiO_3$ Single Crystals, Japanese Journal of Appplied Physics, vol. 21, No. 9, pp. 1298–1302, 1982.

Lopath, Patrick, D. Single Crystal $Pb(Zn_{1/13}Nb_{2/3})$ $O_3$/PbTiO$_3$ (PZN/PT) in Medical Ultrasonic Transducers, Proceedings of the IEEE Ultrasonics Symposium, vol. 2, pp. 1643–1646 (1997).

Lopath, Patrick D., et. al., Ultrasonic Transducers Using Piezoelectric Single Crystal Perovskites, IEEE International Symposium on Applications, of Ferroelectrics vol. 2, pp. 543–546, 1996.

Mulvihill, et al., The Role of Processing Variables in the Flux Growth of Lead Zinc Niobate–Lead Titanate Relaxor Ferroelectric Singi Crystals, Jpn. J. Appl. Phys, vol. 35, p. 51, 1996.

Nomura, S., et. al., Ferroelectric Properties in the System $Pb(Zn_{1/13}Nb_{2/3})$ $O_3$–$PbTiO_3$, J. Phys. Soc. Japan vol. 27, p. 262, 1969.

Nomura, S., Crystal Structure and Piezoelectric Properties of $Pb(Zn_{1/13}Nb_{2/3})$ $O_3$–$PbTiO_3$ Solid Solution, *NEC Research & Development*, No. 29, pp. 15–21, 1973.

Oakley, C. G., et al., Single Crystal Piezoelectrics: A Revolutionary Development for Transducters, 2000 IEEE International Ultrasonics Symposium and Short Courses, Oct. 22–25, 2000 , pp. 1–11.

Panda, R. K., et al., Proceeding of the 9th US–Japan Seminar on Dielectric and Piezoelectric Ceramics, Okinawa, Nov. 2–5, pp. 143 146, 1999.

Park, S. et al., Relaxor–based Single Crystal Materials for Ultrasonic Transducer Applications, Proc. SPIC Metrical Imaging, vol. 3037, pp. 140–147, 1997.

Park S., et al., The Effect of Growth Conditions on the Dielectric Properties of $Pb(Zn_{1/3}Nb_{2/3})O_3$ Single Crystals, Jpn. J. Appl. Phys, vol. 36, p. 1154, 1997.

Park, Seung–Eek, et al., Crystal Growth and Ferroelectric Related Properties of (1–x) $Pb(A_{1/13}Nb_{2/3})O_3$–$XPbTiO_3$, ($A=Zn^{2+}$, $Mg^{2+}$), International Symposium on Applications of Ferroelectrics, vol. 1, pp. 79–82, 1996.

Ritter, T., et al., Single Crystal PZN/PT–Polymer Composites for Ultrasound Transducer Applications, IEEE Transactions on Ultrasonics, Ferroelectrics, and Frequency control, vol. 47, No. 4, pp. 792–800, Jul. 2000.

Saitoh, et al., Forty–channel Phased Array Ultrasonic Probe Using 0.91 $Pb(Zn_{1/3}Nb_{2/3})O_3$–$0.09PbTiO_3$ Single Crystal, IEEE Trans. on UFFC, vol. 46, pp. 152–157, 1999.

Saitoh, Shiroh, et. al., A 3.7 MHz Phased Array Probe Using $0.91Pb(Zn_{1/13}Nb_{2/3})O_3$–$0.09PbTiO_3$ Single Crystal, ISEE Transactions on Ultrasonics, Ferroelectrics, and Frequency Control, vol. 46, No. 2, pp. 414–421, 1999.

Shimanuki, S., et al., Single Crystal of the $Pb(Zn_{1/3}Nb_{2/3})O_3$–$PbTiO_3$ System Grown by the Vertical Bridgeman Method and Its Characterization, Jpn. J. Appl. Phys, vol. 37, No. 6A, pp. 3382–3385.

Shrout, Thomas, et. al., Workshop on Ferroelectric Single Crystals with High Electromechanical Coupling: Growth, Chatacterization, and Applications, Mar. 28, 1996.

Shrout, Thomas, et. al., Dielectric Behavior of Single Crystals Near the (1–x) $Pb(Mg_{1/13}Nb_{2/3})O_3$–x $PbTiO_3$ Morphotropic Phase Boundary, Ferroelectrics Letters, vol. 12, pp. 63–69, 1990.

Takenaka, T,. et.al., Piezoelectric Properties of Grain–Oriented Bismuth Layer–Structured Ferroelectric Ceramics, IEEE, pp. 414–417, 1986.

Tani, T., Crystalline–Oriented Piezoelectric Bulk Ceramics with a Perovskite–Type Structure, Journal of the Korean Physical Society, vol. 32 suppl. issue, pp. S1217–1220, 1998.

Winzer, S.R., et.al., Synthesis and Characterization of PZN–PT,, Proceedings of the Sixth IEEE International Symposium on Applications of Ferroelectrics, pp. 432–436, 1986.

Yamashita, et. al., Synthesis of Lead Scandium Niobate–Lead Titanate Pseudo Binary System Single Crystals, Materials, Materials Research Bulletin, vol. 31, No. 7, pp. 887–895, 1996.

Yonezawa, et al., J. Jpn. Soc. Powder Metallurgy, vol. 16, 253–258, 1969. (Translated abstract0.

* cited by examiner

SINGLE CRYSTAL THICKNESS AND WIDTH CUTS FOR ENHANCED ULTRASONIC TRANSDUCER

The invention was made in part with government funds under Office of Naval Research Grant Number N00014-98-C-0163. Therefore, the U.S. Government has certain rights in the invention.

FIELD OF THE INVENTION

This invention relates to improved cut orientations and dimensions for lead based single crystal compositions including $Pb(Mg_{1/3}Nb_{2/3})O_3$—$PbTiO_3$ ("PMN—PT"), $Pb(Zn_{1/3}Nb_{2/3})O_3$—$PbTiO_3$ ("PZN—PT"), and $Pb(Sc_{1/3}Nb_{2/3})O_3$—$PbTiO_3$ ("PSN—PT"), type relaxor single crystal compositions. Specifically, improved electromechanical properties of single crystals were obtained by orienting the crystal's thickness and width along certain directions. In addition, improved properties were also obtained by preparing single crystals of specific dimensions. These combinations of cut orientations and dimensions give rise to improved crystal processibility and excellent electromechanical properties.

BACKGROUND OF THE INVENTION

A transducer is a device that converts one form of energy to another. For example, ultrasonic transducers convert electrical energy to mechanical energy and vice versa. An ultrasonic transducer includes an ultrasonic transmitting/receiving element(s) typically consisting of piezoelectric element(s) connected to electrodes. The electrical energy supplied to the electrodes electrically excites the ultrasonic probe element(s) causing them to vibrate at a given frequency. The vibrations then give rise to acoustic waves (in this case, ultrasonic waves) which, upon impinging on an interface representing a junction between two media, are either reflected or transmitted. The reflected waves can be detected by the same piezoelectric probe. This reflection and transmission of acoustic waves at the interface between two media is the basis of ultrasonic imaging. An ultrasonic imaging apparatus incorporating this ultrasonic probe has been used to examine the interior of a human body or to detect flaws in a metal welded portion.

B-mode imaging, color flow mapping (CFM), and Doppler are the common ultrasonic diagnostic imaging methods used on human bodies. CFM is capable of two-dimensionally displaying in color the blood flow velocity in organs such as the heart, liver, kidney, spleen or carotid artery by using a Doppler shift of ultrasonic waves caused by the bloodstream, as well as displaying tomographic images (the so-called B-mode images where the echo signals are represented as intensity-modulated lines in a display) of human bodies. Diagnostic capability has been dramatically improved by these medical diagnostic methods.

A commonly used ultrasonic probe configuration comprises an array of a few tens to about 300 ultrasonic transmitting/receiving elements each of which is made of a strip of piezoelectric material. With this configuration, it is difficult to obtain matching with a transmitting/receiving circuit because the impedance of each piezoelectric element increases as the number of ultrasonic transmitting/receiving elements increases. Also, for certain applications, the surface of a phased-array probe has to be kept as small as possible if, for example, the probe used to image the heart through rib spacing or used internally on a live subject.

Ultrasound as an imaging method has tradeoffs. When high frequencies are used, the resolution is improved but the penetration is reduced. Thus, in many cases, more than one transducer is needed to perform a diagnosis because of the necessary penetration depth and resolution. But good penetration and resolution cannot be obtained at the same time. The human tissue has strong non-linear characteristics. When it is imaged by an ultrasonic signals, it generates harmonic signals, such as first, second, and third harmonic signals. Recently, with the advent of tissue harmonic imaging, it is possible to increase penetration by transmitting at a lower fundamental frequency ($f_0$) and at the same time, to increase resolution by detecting the second harmonic signal ($2f_0$) arising from the nonlinear response of the subject.

Another ultrasound application utilizing harmonics is the contrast harmonic imaging. In this type of imaging, the contrast agents used are typically gas-filled microspheres (bubbles) which resonate at certain ultrasonic frequencies. When the contrast agents are insonified at one frequency, they generate large harmonic signals due to the contrast agents' nonlinear response. The use of contrast agent significantly improves the detection of blood-filled structures and blood flow velocity in the arterial systems.

For harmonic imaging, broadband transducers must be used to both transmit and received a bandwidth wide enough to encompass the fundamental and harmonic frequencies. Because current PZT-type transducers do not fulfill this bandwidth requirement, their performance in harmonic imaging is lower than transducers that meet the requisite bandwidth.

Nonetheless, piezoelectric materials such as PZT based ceramics are widely used for medical ultrasound transducers. Two of the important criteria for choosing a piezoelectric material for ultrasound transducer applications are high values of the longitudinal coupling constant ($k_{33}$) and dielectric constant (K). A high coupling constant is desirable because it represents the efficiency of conversion of electrical energy to mechanical energy and vice versa. A high dielectric constant leads to better electrical impedance matching with the system electronics especially for small element phased array transducers. PZT ceramics have a typical $k_{33}$ value of 0.70, but even higher coupling constants are preferred because they would increase not only the transmit and receive efficiency but also the bandwidth of the transducer. The recent discovery of high coupling in lead-based single crystal materials have generated a lot of interest in this regard.

Figure 1:
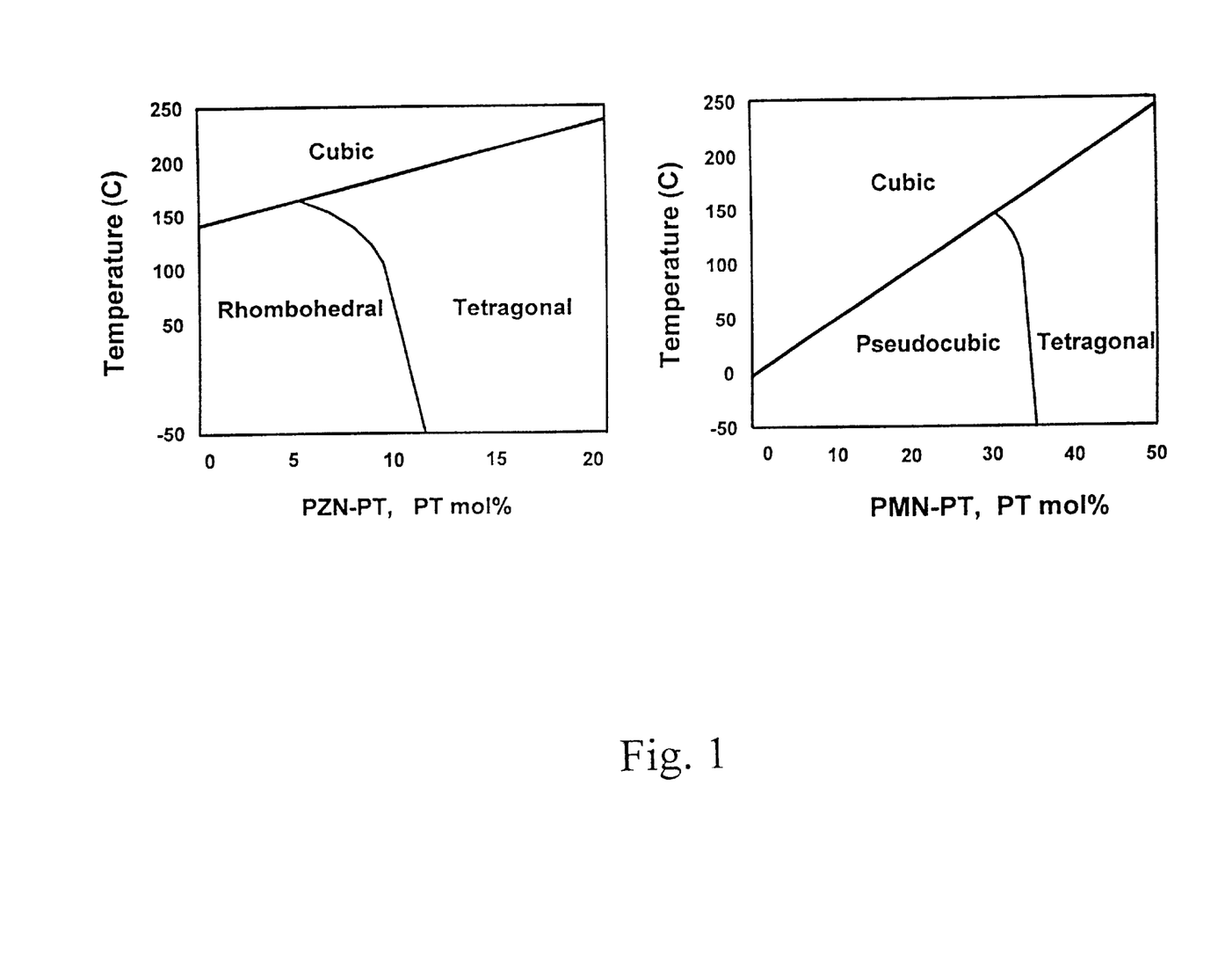
FIG. 1 shows phase diagrams for (a) PZN—PT and (b) PMN—PT.

Lead-based ferroelectric single crystals with the general formula $Pb(B'B'')O_3$ where $B'=Mg^{2+}$, $Zn^{2+}$, $Sc^{3+}$ . . . and $B''=Nb^{5+}$, $Ta^{5+}$ . . . , and the solid solution of these compounds with $PbTiO_3$ have been shown to exhibit excellent electromechanical properties near the morphotropic phase boundary (MPB), the boundary separating the rhombohedral phase (spontaneous polarization along <111>) and the tetragonal phase (polarization along <001>). Some of the important compounds include $Pb(Mg_{1/3}Nb_{1/2}I_3)O_3$—$PbTiO_3$ ("PMN—PT"), $Pb(Zn_{1/3}Nb_{2/3})O_3$—$PbTiO_3$ ("PZN—PT"), and $Pb(Sc_{1/3}Nb_{2/3})O_3$—$PbTiO_3$ ("PSN—PT"). FIG. 1 shows the phase diagram of PZN—PT and PMN—PT.

The electromechanical properties of PZN-9%PT (ratio of PZN to PT is ~10 to 1) single crystals were first reported by Yonezawa et al. in 1969 (*J. Jpn. Soc. Powder Metallurgy*, 16, 253–258 (1969)), then by Kuwata et al. in 1982 (*Ferroelectrics*, 37, 579–582 (1981); *Jpn. J. Appl. Phys.* 21, 1298–1302(1982)). The high coupling constants of these single crystals make them attractive for transducer and actuator applications. These crystals with a composition on the rhombohedral side of the MPB and cut with the thickness along the [001] direction showed very high coupling ($k_{33}$>0.92) and piezoelectric constants ($d_{33}$>1500 pC/N). U.S. Pat. Nos. 5,295,487, 5,402,791, and 5,998,910 describe PZN—PT and PMN—PT systems at various compositions for ultrasonic transducer applications, the contents of which are hereby incorporated in their entirety. Coupling constants for slivers ($k_{33}'$=0.82) and for bars ($k_{33}$=0.92) have been reported for these systems.

Previous work has focused primarily on the <001> longitudinal orientation, and the properties, especially the dielectric properties were found to be unstable near the MPB compositions because the compositions undergo a phase transition from rhombohedral to tetragonal phase. While the <111> orientation has also been investigated for bar-shaped elements, the electromechanical properties along this orientation have been shown to be inferior to those along the <001> orientation. For example, U.S. Pat. No. 5,998,910 and Kuwata et al. in *Jap. J. Appl. Phys.* 21 1298–1302 (1982) report low $k_{33}$ values of only about 0.35–0.68 along the <111> direction. Thus, in their materials the electromechanical properties appear to be very sensitive to the orientation and chemical composition of the crystal.

In addition, previous work disclosed single crystal materials primarily having a bar shape. Very little research have been conducted to understand the effect of the width orientation involving quasi-one dimensional structures such as slivers (see FIG. 2). The results were obtained for slivers that were cut with the thickness and the width along the <001> orientation (see, for example, U.S. Pat. No. 5,402,791). However, slivers cut at the <001> orientation showed the presence of spurious resonance in the frequency range of interest (see Lopath et al., Proceeding of the Tenth IEEE International Symposium on Applications of Ferroelectrics, East Brunswick, Aug. 18–21, 1996, pp. 543–546). For one dimensional (1-D) and 1.5-D transducer applications, it is critical to discover the best combination of both thickness and width orientation cuts to optimize the electromechanical properties of 1 -D or quasi-one dimensional structures such as slivers.

Medical ultrasonic imaging applications cover a wide frequency range spanning 1.5–40MHz depending on the organs to be imaged. The frequency depends on the thickness and sound velocity of the piezoelectric and the matching layer materials (f=v/2t, where f is the transducer frequency, v is the ultrasonic velocity of the piezoelectric material, and t is the material thickness). Thus, high frequency linear array applications at 8–15 MHz require a thickness of only about 130–200 $\mu$m for PZT ceramic materials. PMN—PT or PZN—PT single crystals having a <001> orientation have a lower velocity than PZT-type ceramics, and thus PMN—PT or PZN—PT wafers have to be even thinner (about 100 $\mu$m). Because linear arrays have a typical wafer dimension of 40 mm×4 mm×0.2 mm, manufacturing these extremely thin crystals is very difficult because the crystals' thinness makes them mechanically fragile. For high frequency imaging applications involving eye, intracardiac, and intravascular imaging, the wafer thickness drops to 20–30 $\mu$m. At this thickness range, mechanical processing of <001> orientated single crystals is even more challenging.

Recently, other workers have disclosed PMN—PT and PZN—PT oriented polycrystalline materials for use as ultrasonic transducers. (See Gentilman et al., "Processing and Application of Solid State Converted High Strain Undersea Transmitter Materials," paper presented at the Piezocrystals Workshop, Arlington, Va., Jan. 18–20, 2000). They report only on the <001> orientation. No <011> or <111> oriented polycrystalline materials are disclosed.

SUMMARY OF THE INVENTION

This invention includes a transducer comprising a lead-based single crystal wherein the longitudinal or thickness direction of the crystal is diagonally oriented and has an effective coupling constant of at least 0.70. In one embodiment, the crystal is a face diagonally oriented crystal. Alternatively, the crystal maybe a body diagonally oriented crystal. The longitudinal or thickness direction of the cut may be from about 0 to about 20 degrees from the diagonal orientation.

Preferably, the lead-based crystal is of the formula Pb(B'B")$O_3$—PbTiO$_3$ wherein B' can be at least one of the following: $Mg^{2+}$, $Ni^{2+}$, $Sc^{3+}$, $Yb^{3+}$, $Fe^{3+}$, $Mn^{3+}$, $In^{3+}$, $Ir^{3+}$, $Co^{3+}$ or $Zn^{2+}$, and B" can be at least one of the following: $Nb^{5+}$, $Ta^{5+}$, $Te^{6+}$ or $W^{6+}$. The lead-based crystal may further comprise one or more additional metal or metal oxides wherein the metal is Ba, Bi, Ca, Sr, La or Pt. In one embodiment, the lead-based crystal is of the formula Pb(B'B")$O_3$—PbTiO$_3$ where B' is $Mg^{2+}$, $Zn^{2+}$, $Sc^{3+}$ and B" is $Nb^{5+}$. Specifically, the lead-based crystal is of the formula Pb($Mg_{1/3}Nb_{2/3}$)$O_3$—PbTiO$_3$, Pb($Zn_{1/3}Nb_{2/3}$)$O_3$—PbTiO$_3$, or Pb($Sc_{1/3}Nb_{2/3}$)$O_3$—PbTiO$_3$. The molar ratio of Pb($Mg_{1/3}Nb_{2/3}$)$O_3$ to PbTiO$_3$ may be from about 10:1 to about 1:1, or from about 6:1 to about 3:2 or from about 3:1 to about 5:3. For the lead-based crystal of the formula Pb($Zn_{1/3}Nb_{2/3}$)$O_3$—PbTiO$_3$ and the ratio of Pb($Zn_{1/3}Nb_{2/3}$)$O_3$ to PbTiO$_3$ may be from about 50:1 to about 2:1; or from about 25:1 to about 6:1; or about 15:1 to about 8:1.

Preferably, the crystal has an effective coupling constant of at least 0.80, more preferably of at least 0.85.

The invention also includes a lead-based single crystal wherein the longitudinal or thickness direction of the crystal is diagonally oriented and has an effective coupling constant of at least 0.70 wherein the ratio of the crystal length to thickness to width is from about (300 to 15):(5 to 1):(5 to 1). Preferably, the ratio of the crystal length to thickness to width is from about (150 to 10):(3 to 1):(3 to 1). More preferably, the ratio of the crystal length to thickness to width is from about (100 to 10):(3 to 2):(2 to 1).

In the face diagonal orientated crystals, the crystal has a width orientation of about 35 to 90 degrees, preferably of about 45 to 80 degrees, more preferably about 50 to 70 degrees away from the <011> width orientation. In the body diagonal oriented crystal, the crystal has a width orientation of about ±10 degrees from the <011> width orientation.

In an alternative embodiment, the transducer may comprise a lead-based single crystal orientated slightly off the <001> orientation wherein the longitudinal or thickness direction of the sample is cut from 2 to about 20 degrees off the <001> orientation and the coupling constant is greater than 0.75. Alternatively, the sample is cut from 2 to about 15 degrees (alternatively, 2 to 10 or 2 to 5 degrees) off the <001> orientation and the coupling constant is greater than 0.80.

In another embodiment, a lead-based single crystal orientated in about the <001>$_t$/<010>$_w$ orientation wherein the width orientation of the sample is cut from 2 to about 15 degrees (alternatively, 2 to 10 or 2 to 5 degrees) off the <010> axis and the ratio the crystal length to thickness to width is from about (300 to 15):(5 to 1):(5 to 1). Also, the sample may be cut from 15 to about 25 degrees off the <010> width orientation and the ratio of the crystal length to thickness to width is from (300 to 15):(5 to 3):(2 to 1).

The invention also includes a transducer comprising a plurality of lead-based single crystal transducer elements. Moreover, the lead-based single crystal materials may be embedded in a polymer to form a single crystal/polymer composite. It may be an ultrasonic transducer comprising one or more piezoelectric components that function as transmitting and/or receiving elements; and electrodes placed upon opposite surfaces of the elements, and wherein each lead based piezoelectric component is diagonally oriented and has an effective coupling constant of at least 0.70. In addition, for sliver elements, the ratio of the crystal length to thickness to width is from about (300 to 15):(5 to 1):(5 to 1). For bar elements, the ratio of crystal length to width is (100 to 5):(5 to 1).

In another alternative embodiment the invention includes a transducer comprising lead-based diagonally oriented polycrystalline material. In the polycrystalline material the effective coupling constant may be greater than 0.70, preferably greater than 0.80, more preferably greater than 0.85.

DETAILED DESCRIPTION OF THE INVENTION

This invention includes a transducer comprising a lead-based single crystal wherein the longitudinal or thickness direction of the crystal is diagonally oriented and has an effective coupling constant of at least 0.70. In one embodiment, the crystal is a face diagonally oriented crystal. Alternatively, the crystal may be a body diagonally oriented crystal. The longitudinal or thickness orientation of the crystal may be from about 0 to about 20 degrees from the diagonal orientation (the $<011>$ or $<111>$ axis). Alternatively, the longitudinal or thickness orientation of the cut may be from about 0 to about 15 degrees, from about 0 to about 10 degrees, or from about 0 to about 5 degrees from the $<011>$ or $<111>$ orientation axis. Alternatively, the diagonally oriented materials may be cut using these ranges relative to a width orientatiovbn axis.

Preferably, the lead-based crystal is of the formula $Pb(B'B'')O_3$—$PbTiO_3$ wherein B' can be at least one of the following: $Mg^{2+}$, $Ni^{2+}$, $Sc^{3+}$, $Yb^{3+}$, $Fe^{3+}$, $Mn^{3+}$, $In^{3+}$, $Ir^{3+}$, $Co^{3+}$, or $Zn^{2+}$, and B'' can be at least one of the following: $Nb^{5+}$, $Ta^{5+}$, $Te^{6+}$ or $W^{6+}$. The lead-based crystal may further comprise one or more additional metal or metal oxides wherein the metal is Ba, Bi, Sr, Ca, La or Pt. In one embodiment, the lead-based crystal is of the formula $Pb(B'B'')O_3$—$PbTiO_3$ where B' is $Mg^{2+}$, $Zn^{2+}$, $Sc^{3+}$ and B'' is $Nb^{5+}$. Specifically, the lead-based crystal is of the formula $Pb(Mg_{1/3}Nb_{2/3})O_3$—$PbTiO_3$, $Pb(Zn_{1/3}Nb_{2/3})O_3$—$PbTiO_3$, or $Pb(Sc_{1/3}Nb_{2/3})O_3$—$PbTiO_3$. The molar ratio of $Pb(Mg_{1/3}Nb_{2/3})O_3$ to $PbTiO_3$ may be from about 10:1 to about 1:1, or from about 6:1 to about 3:2 or from about 3:1 to about 5:3. For the lead-based crystal of the formula $Pb(Zn_{1/3}Nb_{2/3})O_3$—$PbTiO_3$, the ratio of $Pb(Zn_{1/3}Nb_{2/3})O_3$ to $PbTiO_3$ may be from about 50:1 to about 2:1; or from about 25:1 to about 6:1; or about 15:1 to about 8:1.

Preferably, the crystal has an effective coupling constant of at least 0.80, more preferably of at least 0.85.

The invention also includes a lead-based single crystal wherein the longitudinal or thickness direction of the crystal is diagonally oriented and has an effective coupling constant of at least 0.70 wherein the ratio of the crystal length to thickness to width is from about (300 to 15):(5 to 1):(5 to 1). Preferably, the ratio of the crystal length to thickness to width is from about (150 to 10):(3 to 1):(3 to 1). More preferably, the ratio of the crystal length to thickness to width is from about (100 to 10):(3 to 2):(2 to 1).

In the face diagonal orientated crystals, the crystal has a width orientation of about 35 to 90 degrees, preferably of about 45 to 80 degrees, more preferably about 50 to 70 degrees away from the $<011>$ orientation. In the body diagonal oriented crystal, the crystal has a width orientation of about ±20 degrees or ±10 degrees from the $<011>$ width orientation.

In an alternative embodiment, the transducer may comprise a lead-based single crystal orientated slightly off the $<001>$ orientation wherein the longitudinal or thickness direction of the sample is cut from 2 to about 20 degrees off the $<001>$ orientation and the coupling constant is greater than 0.75. Alternatively, the longitudinal or thickness orientation of the sample is cut from 2 to about 15 degrees off the $<001>$ orientation and the coupling constant is greater than 0.80. In this case, the cut may also be from about 2 to about 10 degrees or about 2 to about 5 degrees off the $<001>$ axis.

In another embodiment, a lead-based single crystal orientated in about the $<001>_t/<010>_w$ orientation wherein the sample is cut from 2 to about 15 degrees (alternatively, 2 to 10 or 2 to 5 degrees) off the width orientation and the ratio of the crystal length to thickness to width is from about (300 to 15):(5 to 3):(3 to 1). Also, the sample may be cut from 15 to about 25 degrees off the $<010>$ width orientation and the ratio of the crystal length to thickness to width is from (300 to 15):(5 to 3):(2 to 1).

The invention also includes a transducer comprising a plurality of lead-based single crystal transducer elements. Moreover, the lead-based single crystal elements may be embedded in a polymer to form a single crystal/polymer composite. It may be an ultrasonic transducer comprising one or more piezoelectric components that function as transmitting and/or receiving elements; and electrodes placed upon opposite surfaces of the elements, and wherein each lead based piezoelectric component is diagonally oriented and has an effective coupling constant of at least 0.70. In addition, for sliver elements, the ratio of the crystal length to thickness to width is from about (300 to 15):(5 to 1):(5 to 1). For bar elements, the ratio of crystal length to width is (100 to 5):(5 to 1).

In another alternative embodiment the invention includes a transducer comprising lead-based diagonally oriented polycrystalline material. In the polycrystalline material the effective coupling constant may be greater than 0.70, preferably greater than 0.80, more preferably greater than 0.85.

As used herein, the term diagonally oriented describes a piezoelectric element or a single crystal element having a longitudinal or thickness direction along an orientation such as <011> or <111>, which are at an angle relative to the <001> orientation. The term diagonally oriented includes face diagonally oriented, e.g., <011> orientations or all twelve face diagonal orientations. In one embodiment, samples may be cut about ±20 degrees from the <011> orientation. Alternatively, samples may be cut about ±15 degrees from the <011> orientation. Alternatively, samples may be cut about ±10 degrees or ±5 degrees from the <011> orientation. The term diagonally oriented also includes body diagonally oriented samples, e.g., <111> oriented samples or all eight body diagonal orientations. In one embodiment, samples may be cut about ±20 degrees or ±15 degrees from the <111> orientation. Alternatively, samples may be cut about ±10 degrees or ±5 degrees from the <111>.

As used herein, the term effective coupling constant ($k_{33}'$) designates the coupling constant corresponding to the $k_{33}$ mode of an oriented piezoelectric element.

Figure 2:
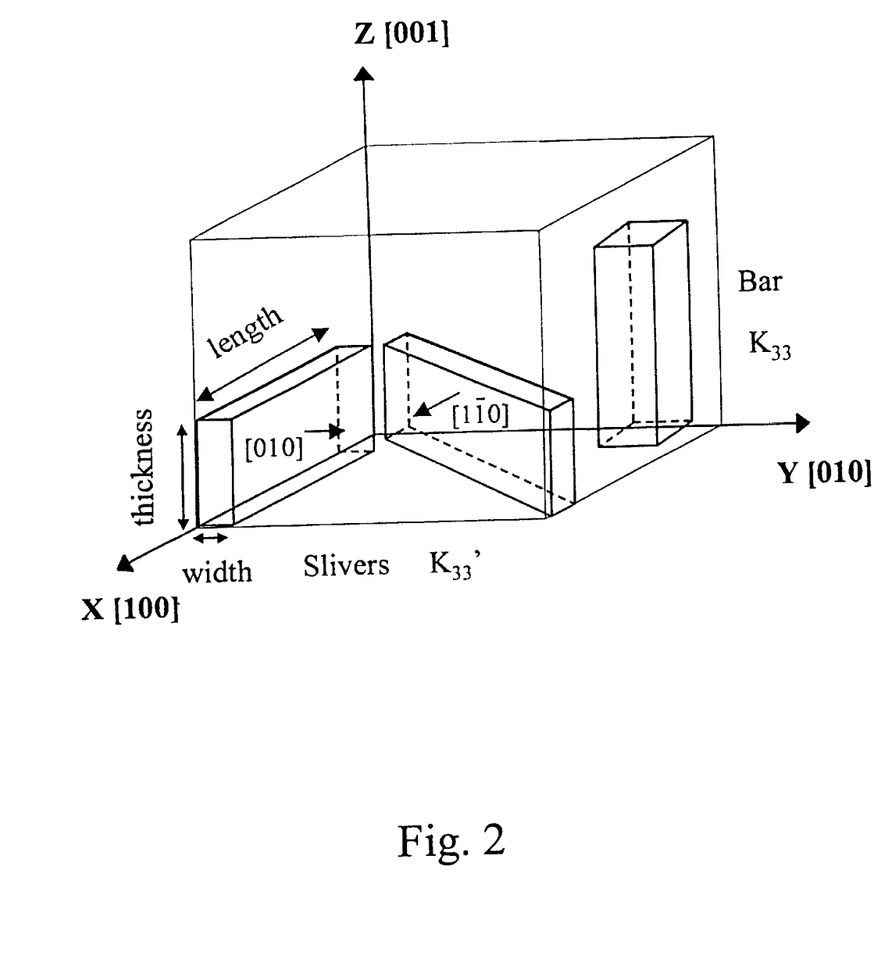
FIG. 2 is a schematic showing two slivers with the thickness oriented along the [001] and width along the [010] and [110] directions, respectively. A [001] longitudinal oriented bar is also shown in the graph.

For one dimensional transducer applications, the single crystal elements are normally diced into sliver shape where the length>thickness>width. For this particular single crystal element shape, both the thickness and width orientations significantly affect the electromechanical properties of the slivers. Here the effective coupling constant ($k_{33}'$ for slivers or for bars with low longitudinal length to width ratio) replaces the longitudinal coupling constant ($k_{33}$ for bars) because of the clamping effect along the sliver length. FIG. 2 is a schematic showing the thickness ([001]) and width ([010], [110]) orientations of single crystal elements in the form of slivers. A [001] longitudinal oriented bar is also shown for comparison.

Aside from the coupling constant, the longitudinal velocity and clamped dielectric constant are also important parameters in designing ultrasound transducers. Both velocity and dielectric constant are a strong function of crystal orientations. By exploiting the difference in material properties at various orientations, better ultrasonic transducers can be designed. For example, high frequency devices (7–40 MHz center frequency) require very thin crystals which give rise to substantial manufacturing defects because of their mechanical fragility. An orientation cut with high longitudinal velocity allows the use of relatively thick crystal for the same center frequency thus minimizing mechanical defects during the manufacturing and processing stages.

This invention includes engineering of PMN—PT and PZN—PT single crystals to obtain improved coupling, higher velocities and dielectric constants. These improvements are accomplished by a range of novel thickness and width cuts which include the <011> and <111> orientations.

Among others, the present invention includes the discovery of: (1) a new orientation cut with longitudinal or thickness orientation at or near <011> orientation with excellent electromechanical properties; (2) the <011> thickness orientated sliver cuts that exhibit very high $k_{33}'$ values with crystal width orientations between 35 to 90 degrees away from the <110> orientation; (3) <001> orientation cuts with longitudinal or thickness orientation slightly off the <001> orientation by about 2 to about 20 degrees; (4) $<001>_t/<010>_w$ sliver cuts with width orientation off the <010> orientation by about 2 to about 25 degrees, more preferably from about 2 to about 15 degrees, which gives high coupling constants; and (5) cuts having thickness orientation at or near <111> that have high velocities and high dielectric constants. These <111> oriented materials allow fabrication of transducer elements using thicker crystals with improved mechanical durability and processing properties.

The present invention discloses a combination of particular thickness and width orientations for compositions near the MPB that exhibit extremely high and stable electromechanical properties for sliver or bar-shaped transducer elements. The experimental examples described below highlight the domain engineering of relaxor single crystals to obtain high coupling and improved sliver velocities and dielectric constants. The results were accomplished by selection of improved single crystal thickness and width cuts.

The present invention also includes improved sliver dimensions that eliminate the presence of spurious resonances. The magnitude of these spurious resonances greatly depends on the aspect ratio of the slivers and the angular orientation of the sliver's width. Also, these spurious resonances are related to the highly directional nature of the velocities in the single crystals. The present invention describes the existence of a critical aspect ratio (width/height) and the width orientation which would provide high coupling constant and clean resonance mode.

There are many ways of growing the single crystals of PMN—PT and PZN—PT. Some of the techniques successfully employed include flux growth (Kobayashi et al. *Jpn. J. Appl. Phys*, 36, 6035 (1997); Mulvihill et al. *Jpn. J. Appl. Phys*, 35, 51 (1996); Park et al. *Jpn. J. Appl. Phys*, 36, 1154 (1997)) and the vertical Bridgeman method (Kobayashi et al. *Jpn. J. Appl. Phys*, 37, 3382 (1998); Harada et al. *Key Eng. Matls.*, 157–158, 95 (1999)), the contents of which are hereby incorporated in their entirety. One of the problems of growing the relaxor single crystals using the flux method is the inability to obtain large crystal sizes suitable for ultrasound transducers. Also, the crystals produced by this method are prone to defects such as inclusions that arise during the growth process. Using the Bridgeman technique, vendors have shown the ability to grow large crystals (diameter <25 mm) with uniform properties within the plates. Several lead-based single crystals have been studied previously. See U.S. Pat. Nos. 5,295,487, 5,402,791, and 5,998,910 which describe PZN—PT and PMN—PT systems at various compositions for ultrasonic transducer applications, the contents of which are hereby incorporated in their entirety.

Figure 3:
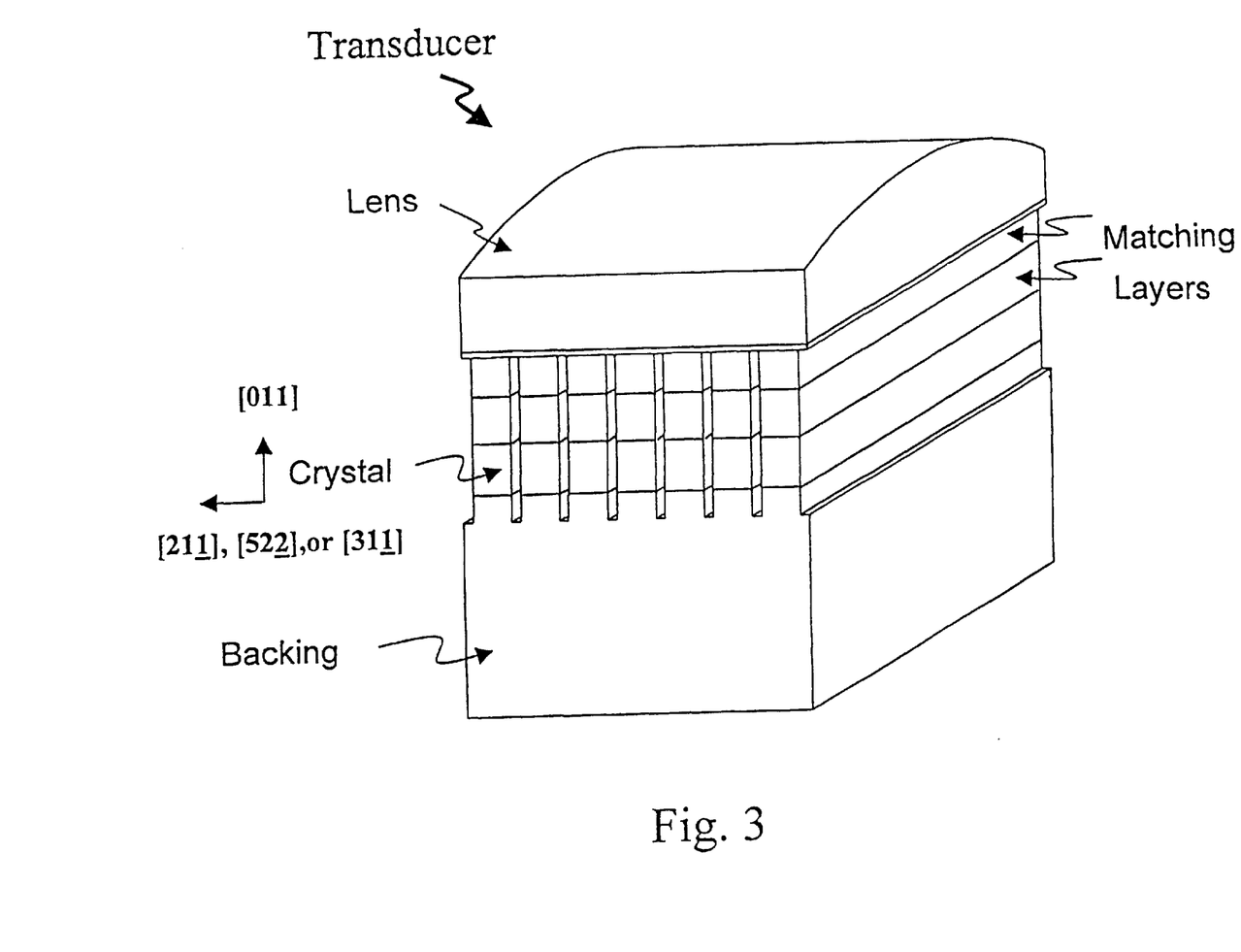
FIG. 3 shows an exemplary arrangement of a plurality of diagonally oriented one dimnsional sliver-shaped elements for a transducer.
Figure 4:
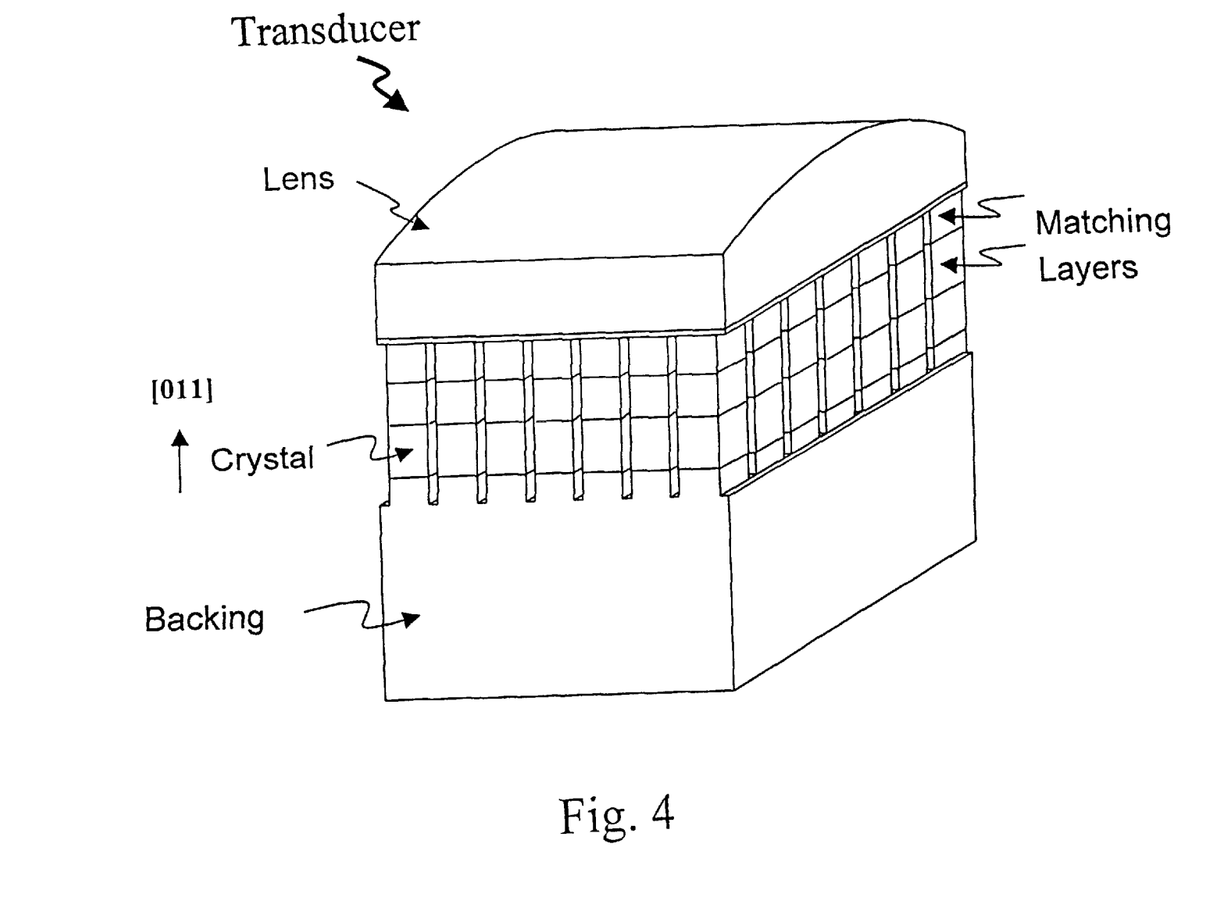
FIG. 4 shows an exemplary arrangement of a plurality of quasi-one dimensional (1.5D)/or two dimensional diagonally oriented elements for a transducer.

Recently, workers have reported the fabrication details of 40-channel single crystal phased-array transducer (Saitoh et al. *IEEE Trans. on UFFC*, 46, 152 (1999)) and a 5 MHz PMN—PT phased array single crystal transducer (Panda et al. Proceeding of the 9th US-Japan Seminar on Dielectric and Piezoelectric Ceramics, Okinawa, Nov. 2–5, 1999 P143–146), the contents of which are hereby incorporated in their entirety. Significant improvements are observed by replacing a PZT ceramic with a PZN-8%PT and PMN—PT single crystals. Accordingly, the lead-based single crystal transducers of this invention may be incorporated into phase array or composite transducers; see also U.S. Pat. No. 5,998,910, the contents of which are incorporated herein in their entirety. Two possible designs with diagonally orientated single crystals for multi-element or phase array transducers are shown in FIGS. 3 and 4. FIG. 3 shows a transducer with a plurality of silver type crystals. FIG. 4 shows a transducer with a plurality of quasi-1 dimensional (1.5D) or 2D single crystals. In these designs, the lead-based single crystal materials may also be embedded in a polymer to form a single crystal/polymer composite.

This invention also includes oriented polycrystalline materials. Both the composition and the various orientations and dimensions disclosed above for single crystals may be similarly applied to oriented polycrystalline materials. These materials are also known as polycrystals or oriented piezoelectric materials.

EXAMPLE A
Crystal Cultivation

Chemical grade PbO, MgO, $Nb_2O_5$, ZnO, and $TiO_2$ were used to form PMN—PT and PZN—PT compositions. The PMN—PT contained 26% to 40% of PT (40 mm (length)× 25 mm (diameter)) and the PZN—PT had compositions of 4.5% and 8% (20 mm (length)×15 mm (thickness)×15 mm (width)) of PT. Bridgman and flux growing techniques were used to grow PMN—PT and PZN—PT single crystals. The single crystals were oriented using the Laue back reflection method and sliced using an ID saw parallel to the (001), (011), and (111) planes to approximately 1 mm in thickness. After the wafers were lapped and polished, gold coating was deposited on opposite surfaces to form the electrodes. The single crystal wafers with <001>, <011>, and <111> thickness orientations were then diced using a dicing saw typically into 10–15 mm×0.3–0.5 mm×0.15–0.3 mm slivers having various width orientation cuts. The longitudinal orientated bars at or near the <001> and <011> orientations were also cut. The length to width aspect ratio of these bars are in the range of 3:1 to about 7:1. The slivers and bars were poled at room temperature in air or in oil and the electromechanical and dielectric properties were measured using an HP 4194A impedance gain phase analyzer.

EXAMPLE B
$<001>_t/<010>_w$ Cuts

Figure 5:
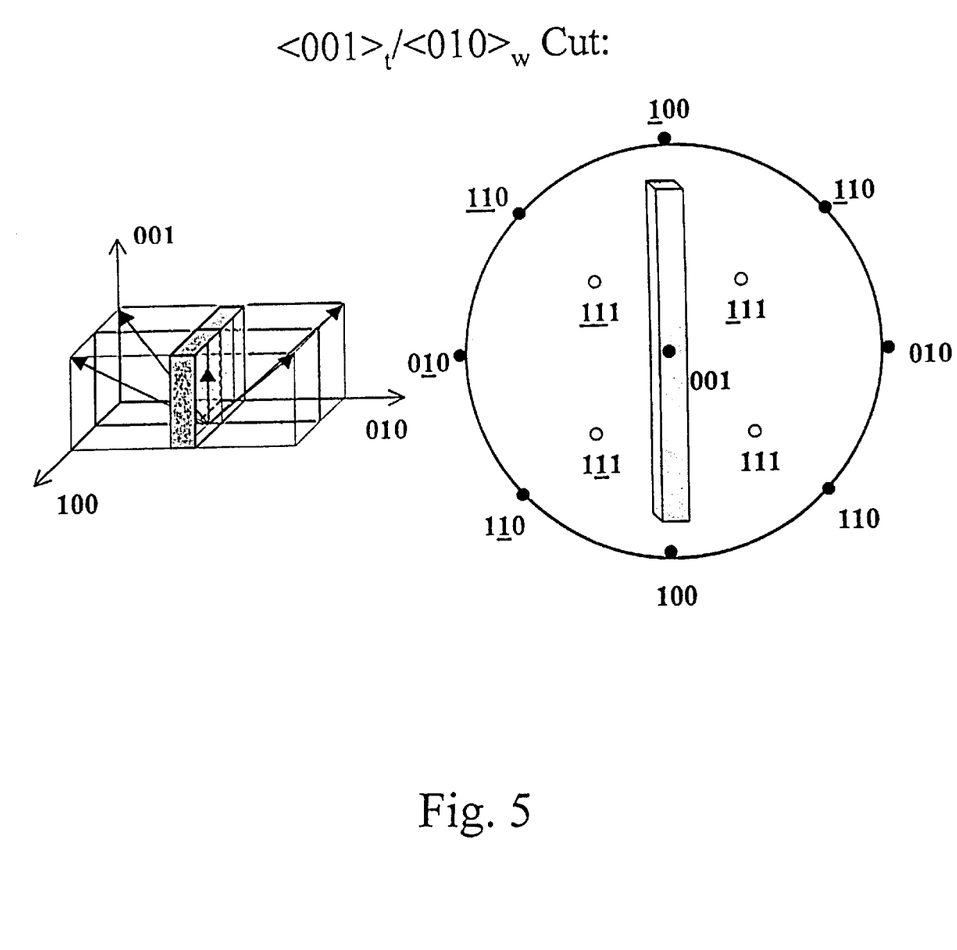
FIG. 5 shows the stereographic projection of the $<001>_t/<010>_w$ cuts. The arrows indicate the polarization directions ($<111>$ orientations) and the poling direction ($<001>$ orientation) respectively.

FIG. 5 shows the stereographic projection of the $<001>_t/<010>_w$ cut, where the sliver thickness orientation lies along <001> and the width orientation along <010>. In the rhombohedral phase, there are four <111> polarization directions along the (001) plane. Each of the polarization direction is 54.7 degree away from the poling direction of <001>. The PMN—PT and PZN—PT slivers, with thickness orientation along <001> and width orientation along <010>, were characterized as a function of PT compositions encompassing rhombohedral and tetragonal phases.

Table 1 lists piezoelectric and dielectric properties of these slivers. As shown in the table, very high effective coupling constant ($k_{33}'$ close to 0.90) can be obtained for the $<001>_t/<010>_w$ slivers at the rhombohedral phase composition near the MPB. The properties, especially the dielectric constant, are a strong function of PT composition. When the PMN—PT composition undergoes a transition from rhombohedral phase (<33% PT in PMN—PT system) to a tetragonal phase (>35% of PT in PMN—PT system), the dielectric constant decreases by more than 40%. The properties of the $<001>_t/<010>_w$ cut would thus appear to be sensitive at the MPB compositions even to slight perturbations such as a minor change in composition.

TABLE 1

The clamped dielectric and electromechanical properties of PMN-PT and PZN-PT slivers with $<00l>_t/<010>_w$ orientation cut.

| PMN-PT $<001>_t/$ $<010>_w$ cuts | Effective Coupling Constant: $k_{33}'$ (Sliver) | Velocity: v (mm/μsec) | Clamped Dielectric Constant: K(1 MHz) |
|---|---|---|---|
| 26–27% of PT (rhom) | 0.77–0.85 | 3.2–3.4 | 1400 |
| 29–30% of PT (rhom) | 0.86–0.90 | 3.1–3.3 | 1400 |
| 32% of PT (rhom) | 0.86–0.89 | 3.1–3.3 | 1400 |
| 34% of PT (MPB) | 0.77–0.80 | 3.3 | 1300 |
| 35–36% of PT (tetra) | 0.73–0.77 | 3.8 | 800 |
| PZN-PT $<001>_t/$ $<010>_w$ cuts | | | |
| 4.5% of PT (rhom) | 0.84–0.87 | 2.5–2.6 | 1100 |
| 8% of PT (rhom) | 0.85–0.88 | 2.4–2.6 | 900 |

EXAMPLE C
$<001>_t/<011>_w$ Cuts and Cuts Between $<001>_t/<010>_w$ and $<001>_t/<011>_w$ The slivers with thickness orientation along <001> and width orientation along <011> were measured at rhombohedral phase compositions. Compared to the $<001>_t/<010>_w$ cut, the $<001>_t/<011>_w$ cut's velocity is much higher but its coupling constant is relatively lower ($v_{<001>/<011>}$=3.8 mm/μsec and $k_{33}'_{<001>/<011>}$=0.78 vs. $v_{<001>/<010>}$=3.2 mm/μsec and $k_{33}'_{<001>/<011>}$=0.87). When compared with the $<001>_t/<010>_w$ cut, the $<001>_t/<011>_w$ cut is very sensitive to the width orientation. For instance, when one moves just a few degrees away from the <011> width orientation, additional resonance peak appears.

Figure 6:
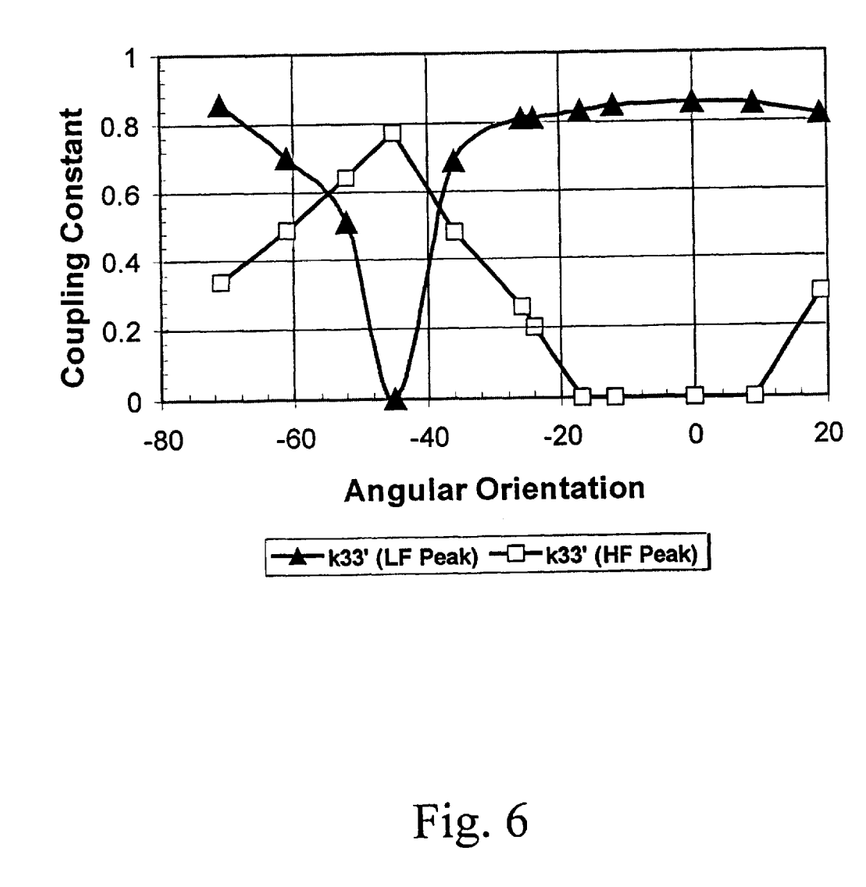
FIG. 6 shows the effective coupling constant of a $<001>$ thickness oriented sliver cut as a function of the width orientation away from the $<010>$ width orientation. $0°=<010>_w$ orientation, $45°=<011>_w$ orientation.

FIG. 6 shows the coupling constant as a function of cutting angle relative to the <010> width orientation. Because the <111> polarization directions in the rhombohedral phase are not clamped along the length direction of the $<001>_t/<010>_w$ cut (see FIG. 5), the coupling constant at this orientation is not very sensitive to the width orientation as shown in FIG. 6. When the cutting angle of the width orientation is more than 15 degrees away from the <010> orientation, an additional resonant mode appears and the effective coupling constant ($k_{33}'$) starts to decrease as the width orientation angle increase.

Figure 7:
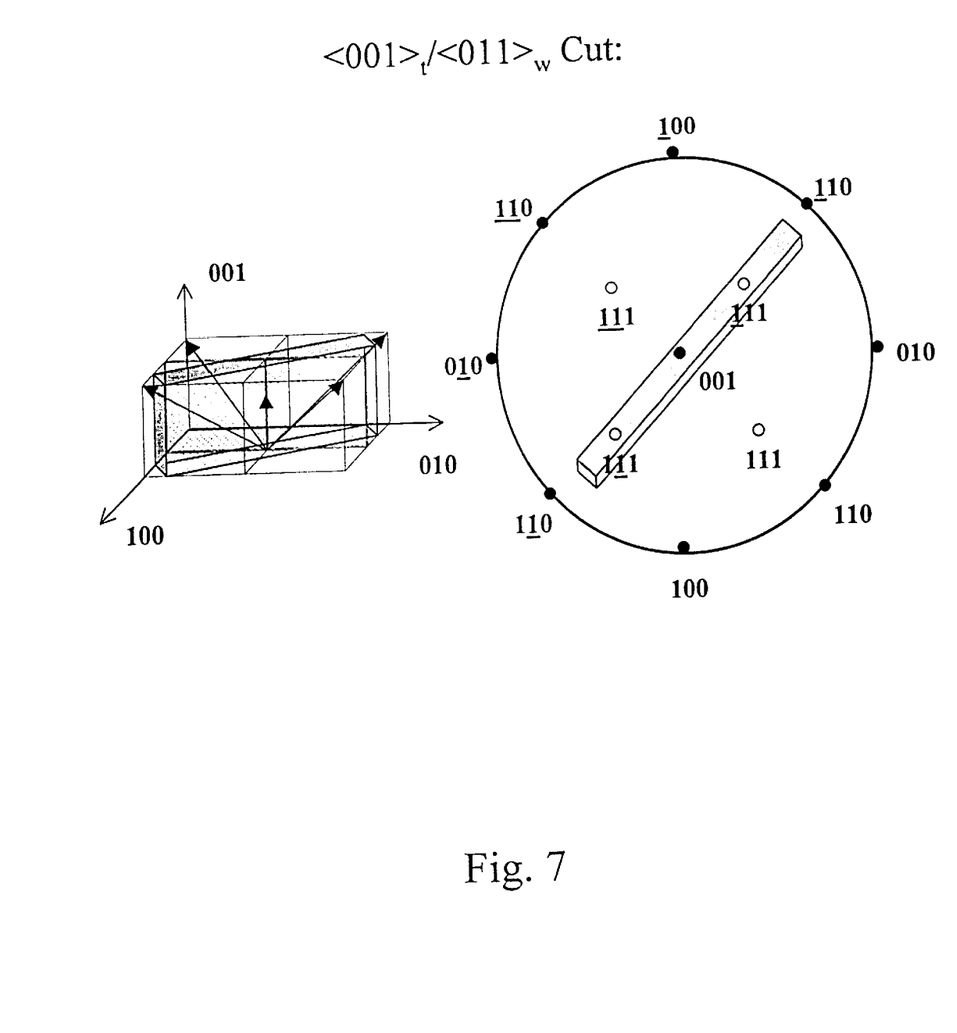
FIG. 7 shows the stereographic projection of the $<001>_t/<011>_w$ cut. The arrows indicate the polarization directions ($<111>$ orientations) and the poling direction ($<001>$ orientation), rspectively.

When the width orientation is along the <011> orientation (the $<011>_t/<011>_w$ cut, which is 45 degrees away from the $<001>_t/<010>_w$ cut), the original main resonance peak disappears and the additional resonance peak becomes the main peak. Because two of the four <111> polarization directions are clamped along the sliver length direction as shown in FIG. 7, this cut is sensitive to the width orientation.

The above findings indicate that the $<001>_t/<010>_{w±15\ degree}$ cut offers flexibility in designing transducers because they allow processing within more than a 30 degree range of width orientations without a change in their electromechanical properties.

EXAMPLE D
Aspect Ratios with Clean Resonance Modes

All the specimens described in this work were oriented along the <001> thickness direction with a thickness of 285 μm and lengths greater than ten times the thickness.

Figure 8:
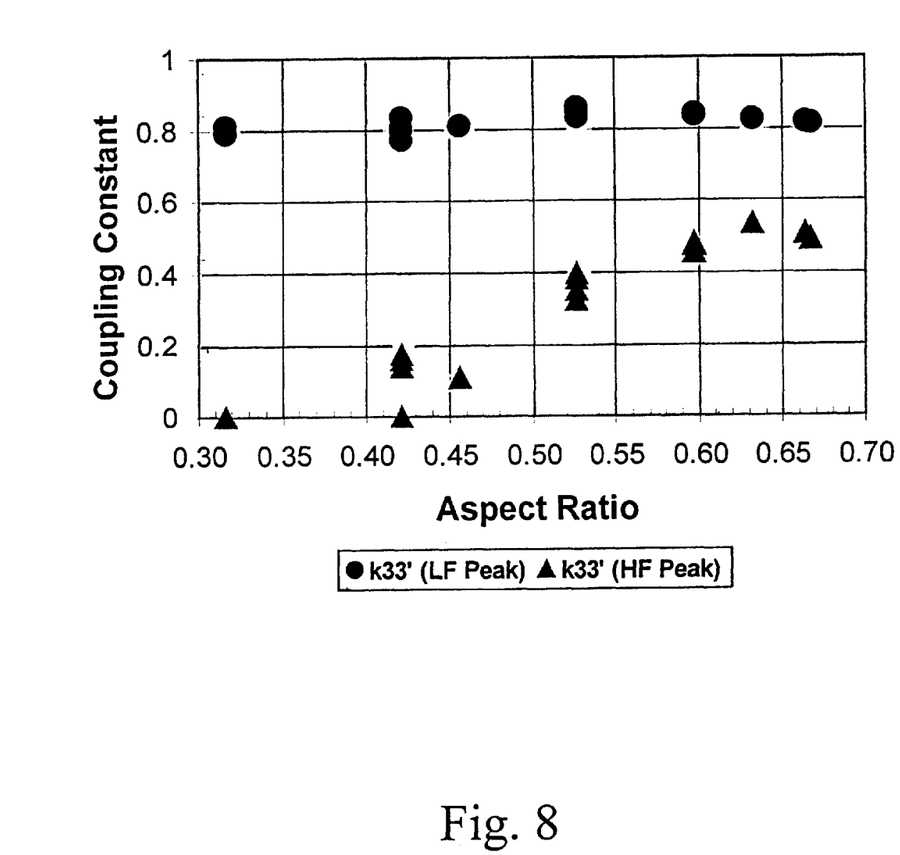
FIG. 8 shows a plot of the coupling constant as a function of the width to thickness aspect ratio.

Slivers with an aspect ratio of 0.67–0.32 (width/height) were cut with the width oriented 23° away from the <010> orientation. The slivers showed two major resonance peaks in the frequency range of interest. An interesting phenomenon was discovered upon decreasing the aspect ratio (width/height) of these slivers. The intensity of the spurious mode became weaker with decreasing aspect ratio. As shown in FIG. 8, this mode finally disappeared completely for aspect ratios less than 0.43. Thus, the fabrication of low aspect ratio slivers with <001> orientation along the thickness should provide a single clean resonance peak with high coupling, up to 25 degrees from the <010> width orientation.

EXAMPLE E

<001> and <011> Longitudinal Orientated Bar Samples

Bar-shaped samples were also characterized. The bars, having a PMN-31%PT composition and a length-to-width aspect ratio of 7:1 and 3:1, were oriented longitudinally along the <001> and the <011> orientations. Coupling constants of $k'_{33}$ higher than 0.90 were obtained on both <001> and <011> orientation (See Table 2A and 2B). This data indicates that not only the <001> orientation cut offers excellent coupling constants, but also the <011> orientation. Very little differences were observed in these two orientations. Table 2B show that even if the orientation cuts were shifted slightly off the <001> and <011> orientations, up to 15 degrees, the coupling constants remained very high and relatively unchanged.

TABLE 2A

The effective coupling constants of PMN-PT 31% cuts at <001>, <011> and <111> orientations. (Sample geometry: 6.0 mm × 0.9 mm × 0.9 mm

| PMN-PT 31% (bar, L:W = 7:1) | Effective Coupling Constant $k'_{33}$ | Velocity (mm/μsec) |
| --- | --- | --- |
| <001> | 0.93 | 3.5 |
| <011> | 0.91 | 3.8 |

TABLE 2B

The effective coupling constants of PMN-PT 31% cuts at or near <001>, <011> orientations (Sample geometry: 2.4 mm × 0.8 mm × 0.8 mm)

| PMN-PT 31% (bar, L:W = 3:1) | Effective Coupling Constant $k'_{33}$ |
| --- | --- |
| <001> 0 degree | 0.89 |
| <001> 2.5 degree | 0.87 |
| <001> 5 degree | 0.88 |
| <001> 10 degree | 0.87 |
| <011> 15 degree | 0.85 |
| <011> 0 degree | 0.88 |
| <011> 2.5 degree | 0.87 |
| <011> 5 degree | 0.86 |
| <011> 10 degree | 0.85 |
| <011> 15 degree | 0.83 |

EXAMPLE F

$<011>_t/<010>_w$, $<011>_t/<110>_w$ Cuts

Figure 9:
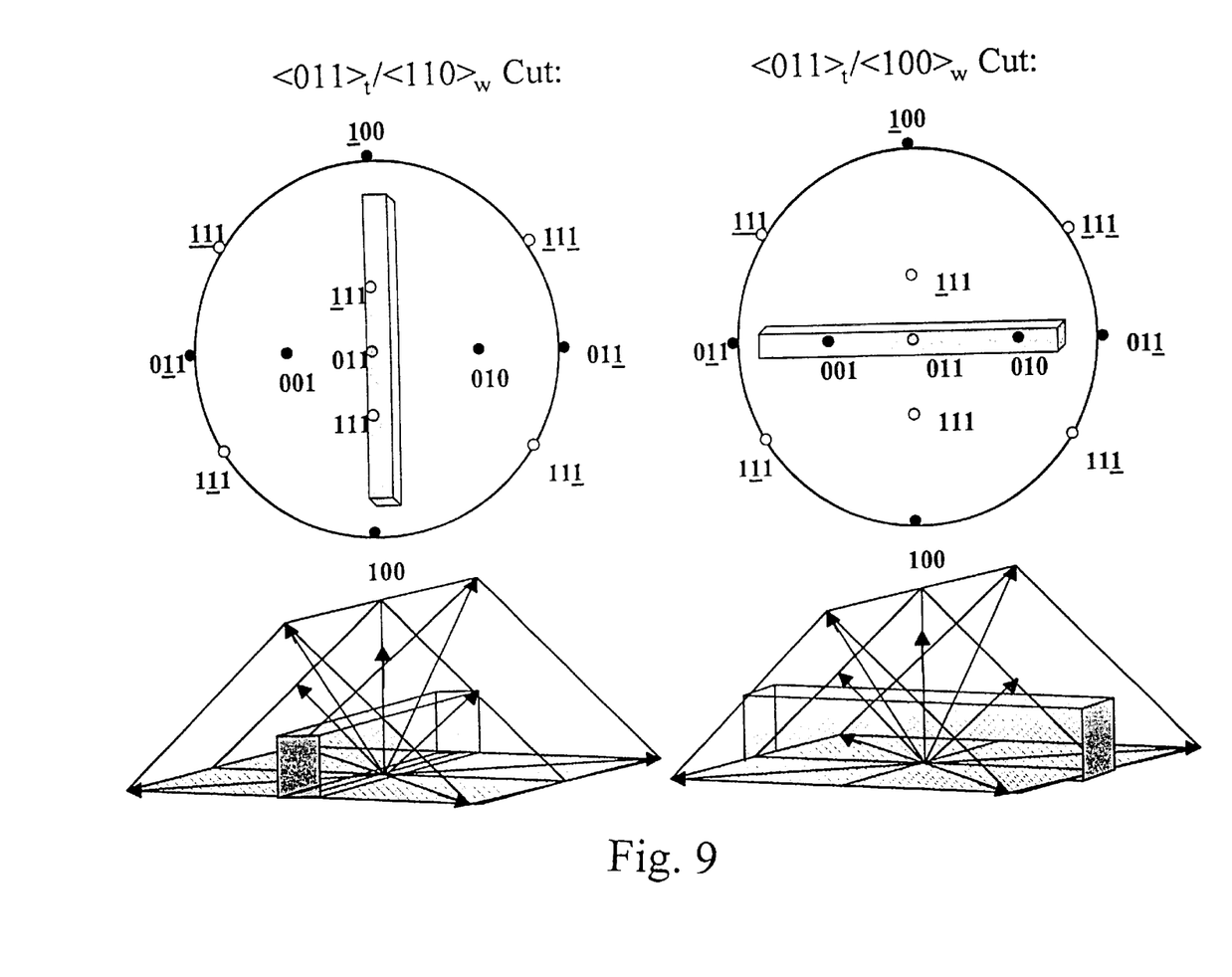
FIG. 9 shows the stereographic projections of the $<011>_t/<110>_w$ and $<011>_t/<100>_w$ cuts.

PMN—PT single crystals with thickness orientation along <011> were investigated for the existence of orientation cuts having favorable electromechanical properties. FIG. 9 shows the stereographic plots of both $<011>_t/<110>_w$ and $<011>_t/>010>_w$ cuts. As shown in the <011> stereographic projection of the figure, there are two <111> and two <001> polarization directions along the (011) plane. Each of them is 35.3° or 45° away from the <011> poling direction (also the thickness orientation). Unlike the <001> thickness orientation, none of the polarization directions in rhombohedral and tetragonal phases is parallel to the <011> thickness orientation (or poling direction). It is expected that the dielectric and electromechanical properties of this cut will be less sensitive to the rhombohedral-tetragonal phase transition compared to the <001> orientation cut.

Due to the clamping effect, the $k_{33}'$ for the rhombohedral $<011>_t/<110>_w$ cut is very low but the velocity is very high. On the other hand, the clamping effect for the $<011>_t/<010>_w$ cut is very small for rhombohedral phase, so the $<011>_t/010>_w$ gives relatively high $k_{33}'$ and moderate velocity. Table 3 lists the effective coupling constant and longitudinal velocity of $<011>_t/<110>_w$ and $<011>_t/<010>_w$ orientation cuts.

TABLE 3

Electromechanical properties of $<011>_t/<110>_w$ and $<011>_t/<010>_w$.

| PMN-PT 32% | Effective Coupling Constant $k_{33}'$ (sliver) | Velocity (mm/μsec) |
| --- | --- | --- |
| $<011>_t/<110>_w$ Cut | 0.46 | 5.0 |
| $<011>_t/<010>_w$ Cut | 0.82 | 3.9 |

EXAMPLE G

$<011>_t/<211>_w$, $<011>_t/<522>_w$, $<011>_t/<311>_w$ Cuts and Variable Angle Cuts from <110> to <010> Orientations Table 4 shows the effective coupling constants of PMN—PT slivers with thickness orientation along <011> and width orientations between the <110> and <010> orientations. When both <111> and <001> polarization directions are not clamped along the width direction, very high coupling constants can be obtained from these slivers. As shown in Table 4, $k_{33}'$ as high as 0.90 can be obtained for slivers with width orientations from 50 to 70 degrees away from <110>. These $<011>_t/<110>_{w\ 50-70\ degree}$ cuts include the $<011>_t/<211>_w$ (55.4°), $<011>_t/<522>_w$ (60.4°), and $<011>_t/<311>_w$ (63.4°) cuts. Not only do the $<011>_t/<110>_{w\ 50-70\ degree}$ cuts exhibit very high values of $k_{33}'$, but their properties also show little sensitivity to the width orientation over a wide range of angles which enables easier transducer fabrication. These results demonstrate that the <011> orientation offers a range of useful thickness cuts with excellent coupling properties for transducer applications.

TABLE 4

The effective coupling constant and longitudinal velocity of PMN-PT slivers with $<011>_t/<110>_{w\ 0-90\ degree}$ orientation cuts.

| PMN-PT 32% | Effective Coupling Constant $k_{33}'$ (sliver) | Velocity (mm/μsec) |
| --- | --- | --- |
| $<011>_t/<110>_{w\ 0\ degree}$ | 0.46 | 5.0 |
| $<011>_t/<110>_{w\ 35\ degree}$ | 0.72 | 3.4 |
| $<011>_t/<110>_{w\ 40\ degree}$ | 0.79 | 3.3 |
| $<011>_t/<110>_{w\ 50\ degree}$ | 0.88 | 3.1 |
| $<011>_t/<110>_{w\ 55\ degree}$ ($<011>_t/<211>_w$ cut) | 0.90 | 3.1 |
| $<011>_t/<110>_{w\ 60\ degree}$ $<011>_t/<522>_w$ cut) | 0.90 | 3.1 |
| $<011>_t/<110>_{w\ 65\ degree}$ ($<011>_t/<311>_w$ cut) | 0.90 | 3.2 |
| $<011>_t/<110>_{w\ 70\ degree}$ | 0.88 | 3.3 |
| $<011>_t/<110>_{w\ 75\ degree}$ | 0.86 | 3.5 |
| $<011>_t/<110>_{w\ 80\ degree}$ | 0.85 | 3.6 |
| $<011>_t/<110>_{w\ 90\ degree}$ $<011>_t/<010>_w$ cut) | 0.82 | 3.9 |

EXAMPLE H
$<111>_t/<011>_w$ Cut

Figure 10:
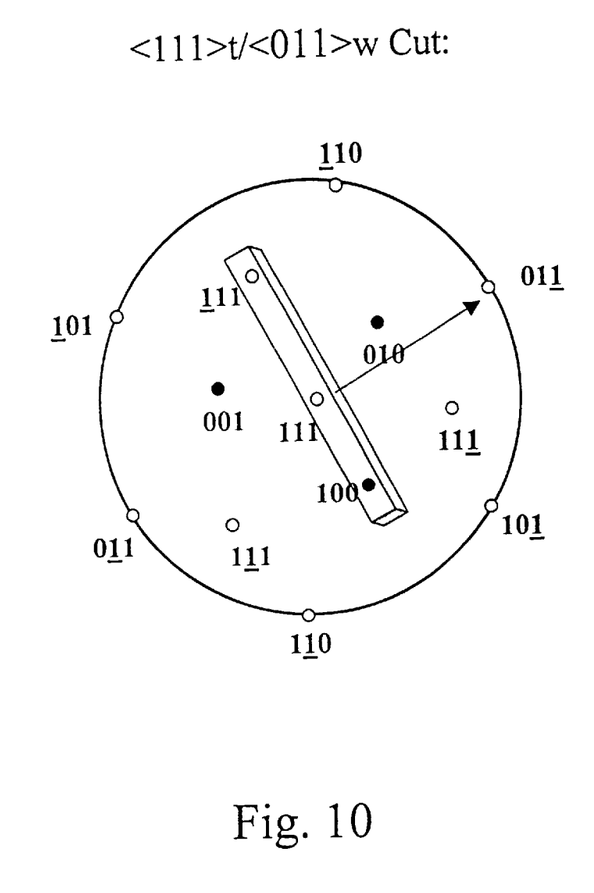
FIG. 10 shows the stereographic projection of the $<111>_t/<011>_w$ cut.

FIG. 10 depicts the stereographic projection of the $<111>_t/<011>_w$ cut. Table 5 shows the electromechanical properties of PMN—PT slivers with thickness orientation along <111> and width orientations at and near the <011> orientation. While their coupling constants are slightly lower than those of the $<001>_t/<110>_{w\pm15\ degree}$ and $<011>/<110>_{w\ 50-70\ degree}$ cuts, the $<111>_t/011>_w$ cut's dielectric constants are 2–3 times greater and its velocities are 50% higher than those of the $<001>_t/<010>_w$ cut. Also, the acoustic properties of this orientation cut are less sensitive to the width orientation as shown in Table 5.

The $<111>_t/<011>_w$ cut offers a much higher velocity coupled with excellent dielectric properties compared to those of the PZT-type ceramics or other orientation cuts of PMN—PT and PZN—PT single crystals. The high velocity (50% higher for the <111> orientation than in the <001> orientation) allows the use of thicker crystals which in turn improves the manufacturability of transducers for high frequency applications. The high dielectric constant, on the other hand, permits a design with low electrical impedance which enhances electrical impedance matching between the transducers and the electronic circuits.

TABLE 5

Electromechanical properties of $<111>_t/<011>_w$ cuts.

| PMN-PT 34% $<111>_t/<011>_w$ cuts | Effective Coupling Constant: $k_{33}'$ (Sliver) | Velocity: v (mm/μsec) | Clamped Dielectric Constant: K (1 MHz) |
|---|---|---|---|
| $<111>_t/<011>_{w\ 0\ degree}$ | 0.76 | 5.0 | 3050 |
| $<111>_t/<011>_{w\pm5\ degree}$ | 0.76 | 4.9 | 3050 |
| $<111>_t/<011>_{w\pm10\ degree}$ | 0.75 | 4.9 | 3050 |

EXAMPLE I
Diagonally Oriented Lead-based Polycrystalline Materials

Gentilman disclosed the injection molding method to fabricate oriented polycrystal PMN—PT and PZN—PT materials from the <001> oriented single crystal seeds (see Gentilman, "Processing and Application of Solid State Converted High Strain Undersea Transmitter Materials," paper presented at the Piezocrystals Workshop, Arlington, Va., Jan. 18–20, 2000). As with single crystal materials, polycrystalline-based materials may also exhibit favorable properties that are determined by their thickness or width orientations. Using similar methods, polycrystalline PMN—PT or PZN—PT are partially aligned along the <011> and <111> directions. Because the single crystals described in this application which are also oriented along the <011> and <111> directions possess improved electromechanical properties over a wide range of angles (up to 15 degrees), the aligned polycrystalline ceramics may likewise achieve improved properties comparable to those of similarly oriented single crystals. Because processing polycrystalline ceramics is cheaper than growing single crystals, the use of oriented polycrystalline PMN—PT and PZN—PT, instead of their single-crystal counterparts, would allow fabrication of transducers at significantly lower cost. This makes polycrystalline materials attractive for transducer applications.

Figure 11:
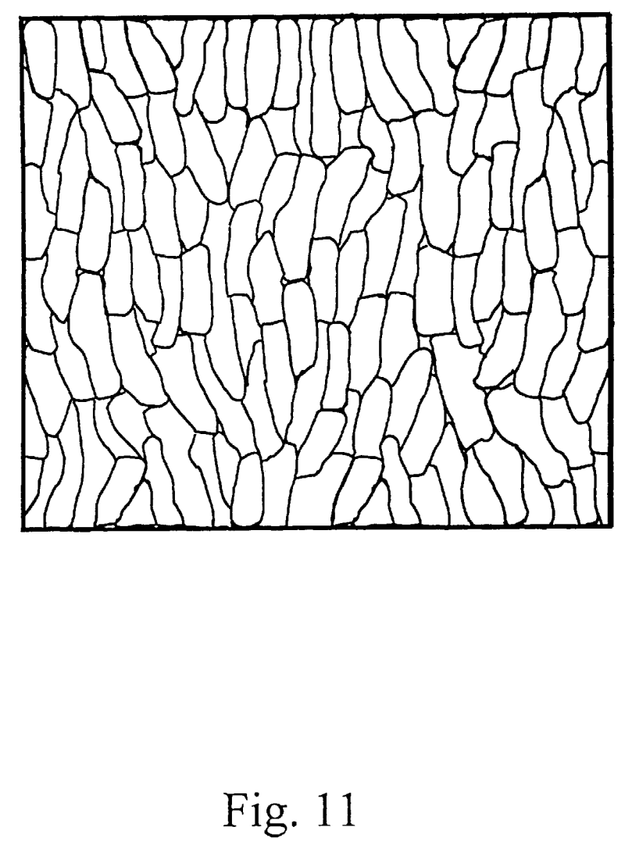
FIG. 11 shows a schematic drawing of an orientated polycrystalline material.

The oriented polycrystalline ceramic is fabricated by mixing long rods of diagonal oriented single crystal seeds (prepared as described above using chemical grade PbO, MgO, $Nb_2O_5$, ZnO, and $TiO_2$) with ceramic powder and applying a shear pressure to align the seeds. The following fabrication methods are used to align the single crystal seeds: extrusion, injection molding, tape casting, etc. The sintering process allows the single crystal seeds to grow into a ceramic matrix that is partially oriented due to and according to the alignment of the seeds see FIG. 11. The sintered polycrystalline materials are cut into <011> or <111> orientations and expected to have properties similar to those of single crystals. For a reference on the preparation of a textured polycrystalline material, specifically $Sr_2Nb_2O_7$, see Braharmaroutu et al. Proceedings of the Tenth IEEE International Symposium on Applications of Ferroelectrics, East Brunswick, N.J., Aug. 18–21, 1996, page 883–886, the contents of which is incorporated in its entirety into the present application.

We claim:

1. A transducer comprising a lead-based single crystal wherein the longitudinal or thickness direction of the crystal is <011> oriented and has an effective coupling constant of at least 0.70.

2. The transducer of claim 1 wherein the longitudinal or thickness direction of the cut is from about 0 to about 20 degrees off the <011> orientation.

3. The transducer of claim 1 wherein the longitudinal or thickness direction of the cut is from about 0 to about 10 degrees off the <011> orientation.

4. The transducer of claim 1 wherein the crystal has a width orientation of about 35 to 90 degrees away from the <011> width orientation.

5. The transducer of claim 1 wherein the crystal has a width orientation of about 45 to 80 degrees away from the <011> width orientation.

6. The transducer of claim 1 wherein the crystal has a width orientation of about 50 to 70 degrees away from the <011 > width orientation.

7. The transducer of claim 1 wherein the crystal has a width orientation of about ±10 degrees from the <011> width orientation.

8. A transducer comprising a lead-based single crystal wherein the crystal is oriented in the <011> orientation along the longitudinal or thickness direction.

9. The transducer of claim 8 wherein the <011> orientation is cut from about 0 to about 20 degrees off the longitudinal or thickness direction.

10. A transducer comprising a lead-based single crystal wherein the longitudinal or thickness direction of the crystal is <111> oriented and has an effective coupling constant of at least 0.75.

11. The transducer of claim 10 wherein the longitudinal or thickness direction of the cut is from about 0 to about 20 degrees off the <111> orientation.

12. The transducer of claim 11 wherein the crystal has a width orientation of about 35 to 90 degrees away from the <111> width orientation.

13. The transducer of claim 11 wherein the crystal has a width orientation of about 45 to 80 degrees away from the <111> width orientation.

14. The transducer of claim 11 wherein the crystal has a width orientation of about 50 to 70 degrees away from the <111> width orientation.

15. The transducer of claim 10 wherein the longitudinal or thickness direction of the cut is from about 0 to about 10 degrees off the <111> orientation.

16. The transducer of claim 15 wherein the crystal has a width orientation of about ±10 degrees from the <111> width orientation.

* * * * *